(12) United States Patent
Maiuzzo et al.

(10) Patent No.: US 8,006,170 B2
(45) Date of Patent: Aug. 23, 2011

(54) FAULT TOLERANT DECODING METHOD AND APPARATUS INCLUDING USE OF QUALITY INFORMATION

(75) Inventors: Michael Maiuzzo, Queenstown, MD (US); Jesse David Warner, Annapolis, MD (US); Theodore L. Harwood, Hollywood, MD (US); John P. Smith, Millersville, MD (US)

(73) Assignee: Sentel Corporation, Alexandria, VA (US)

( * ) Notice: Subject to any disclaimer, the term of this patent is extended or adjusted under 35 U.S.C. 154(b) by 1106 days.

(21) Appl. No.: 11/761,671

(22) Filed: Jun. 12, 2007

(65) Prior Publication Data

US 2007/0234171 A1    Oct. 4, 2007

Related U.S. Application Data

(60) Continuation-in-part of application No. 11/473,658, filed on Jun. 23, 2006, now Pat. No. 7,549,106, which is a division of application No. 10/116,132, filed on Apr. 5, 2002, now Pat. No. 7,093,188.

(51) Int. Cl.
*H03M 13/00* (2006.01)
(52) U.S. Cl. .................. 714/780; 714/795; 714/758
(58) Field of Classification Search .......... 714/780, 714/795, 784, 755, 786, 758
See application file for complete search history.

(56) References Cited

U.S. PATENT DOCUMENTS

| | | | |
|---|---|---|---|
| 5,511,081 A | | 4/1996 | Hagenauer |
| 5,606,569 A | * | 2/1997 | MacDonald et al. .......... 714/758 |
| 5,825,807 A | | 10/1998 | Kumar |
| 6,029,264 A | | 2/2000 | Kobayashi et al. |
| 6,078,625 A | * | 6/2000 | McCallister et al. .......... 375/261 |
| 6,108,811 A | | 8/2000 | Nakamura et al. |
| 2001/0025358 A1 | | 9/2001 | Eidson et al. |
| 2002/0034269 A1 | | 3/2002 | Demjanenko et al. |

FOREIGN PATENT DOCUMENTS

| | | |
|---|---|---|
| EP | 1 187 340 A2 | 3/2002 |
| WO | 01/48927 A1 | 7/2001 |

* cited by examiner

*Primary Examiner* — Fritz Alphonse
(74) *Attorney, Agent, or Firm* — The Marbury Law Group, PLLC

(57) ABSTRACT

A bit quality evaluator receives a sequence of bits. A quality measure is assigned to each bit within the sequence. The bit sequence and the quality measures are provided to a decoding device that performs soft decision convolutional decoding on the sequence of bits using the quality measure. An off-path detector detects an occurrence of a trellis decode path change during the convolutional decoding operation and identifies a first symbol proximate corresponding to the occurrence of the trellis decode path change. An erasure decision circuit identifies at least the first symbol for erasure. The output of the first decoder and the erasure decision circuit are received at a second decoder, which decoder decodes the output of the first decoder after erasing at least the first symbol. The erasure decision circuit may also identify additional symbols for erasure based on performance measures of the trellis decode path and the quality measure of the sequence of bits.

12 Claims, 8 Drawing Sheets

FAULT TOLERANT DECODING METHOD AND APPARATUS INCLUDING USE OF QUALITY INFORMATION

CROSS REFERENCE TO RELATED APPLICATIONS

This application is a continuation-in-part of application Ser. No. 11/473,658, filed Jun. 23, 2006 now U.S. Pat. No. 7,549,106, which is a divisional of application Ser. No. 10/116,132, filed Apr. 5, 2002, now U.S. Pat. No. 7,093,188. The Ser. No. 11/473,658 application and the '188 patent are incorporated by reference herein, in their entireties, for all purposes.

FIELD OF THE INVENTION

The field of the invention relates to a method and apparatus for data transmission with low error rates.

BACKGROUND INFORMATION

Forward Error Correction (FEC) is a common method of achieving data transmission with low error rates. FEC coding techniques transmit data in encoded form by encoding the data with added redundancy or parity data, which is used by a decoding device to detect and correct errors introduced during transmission or passage of the data between a source and a destination. Generally, data does not have to be retransmitted to correct errors.

The ability of FEC systems to correct errors without retransmission makes them suitable for use in satellite communications systems. Many satellite communications systems use a conventional form of FEC coding; concatenated Viterbi and Reed Solomon coding. Convolutional encoding with Viterbi decoding is capable of correcting disperse, scattered errors, as caused, for example, by white noise. Reed Solomon (block) coding is capable of correcting limited-size burst errors, as caused, for example, by pulsed noise or fast fading. In combination, concatenated convolutional and Reed Solomon coding improve system performance in the presence of pulse and scattered interference.

SUMMARY OF THE INVENTION

Embodiments allow FEC coding systems to compensate for pulse error patterns, as for example, are typically introduced by multiple interfering and/or high duty cycle radars.

The various embodiments provide a method or apparatus for decreasing the bit error rate (BER) of decoded concatenated Reed Solomon and convolutionally encoded data.

Some embodiments provide a system for predicting when a Viterbi decoder in a concatenated decoder is likely to erroneously decode a portion of data.

Some embodiments provide a system for using bit quality information to both use soft-decision Viterbi decoding and to predict or detect when a segment of convolutionally encoded data is likely to be erroneously decoded by a Viterbi soft-decision decoder.

Some embodiments provide a system for tagging for erasure decoded symbols output by a Viterbi soft-decision decoder that will be further decoded by Reed Solomon decoding using erasure.

Some embodiments provide a decoding unit with a Viterbi decoder providing input to Reed Solomon decoder, where both decoders perform soft-decision based decoding according to bit-quality data of the bits being decoded.

Some embodiments provide a system with a concatenated Reed Solomon and Viterbi decoder, where the system tags for erasure Viterbi decoder output that has been identified, in part, by a sliding window detector that identifies or detects bursts of low quality bits in the Viterbi input.

Some embodiments provide a system with a concatenated Reed Solomon and Viterbi decoder, where the system tags for erasure Viterbi decoder output that has been identified, in part, by a high cost factor condition wherein no low cost alternative exists amongst the alternative paths, and when the high cost choices lingers over an excessively long duration.

Some embodiments provide a system with a concatenated Reed Solomon and Viterbi decoder, wherein the system tags for erasure Viterbi decoder output that has been identified, at least in part, by the occurrence of an "off track" event when the Viterbi decoder encounters a sequence of bits that causes the decoder to jump to a different point in the decode trellis as corresponding to a better maximum likelihood choice.

Some embodiments provide a system capable of improved decoding of data encoded with conventional concatenated Reed Solomon and convolutional encoders, without requiring modifications of existing encoders.

Some embodiments provide a concatenated decoding unit where a first decoder is concatenated with a second decoder, and both decoders perform soft-decision decoding based directly or indirectly on the correctness of bits of data before they are decoded by the first decoder.

Some embodiments provide a process and apparatus for making decisions regarding the consecutive number of block code (e.g., Reed-Solomon) symbols to be erased. In the case of a RS(255, 239) 8-bit Reed-Solomon code, 8 symbols can be corrected while up to 16 can be erased. This process is designed to identify groups of one, two, or three symbols that are likely erroneous and erases them prior to the block decode. The event to initially identify likely erroneous symbols is the occurrence of a sequence of bits being decoded by the Viterbi decoder that cannot possibly have occurred at the transmitter. When this occurs it is an indication that the Viterbi decode has gone "off track" or has been off track and has been restored to a correct decode path or has jumped between two incorrect paths. An initial decision is made upon occurrence of this event to erase the single block code symbol proximate the "incapable of being correctly decoded" sequence of bits. An additional second or third symbol may be determined to be erased, depending upon other aspects of the process, however the initial identification is made by this even being identified. The decision of whether to expand the erasure to a second or third consecutive symbol, and which direction in time those additional erasures are to be made is influenced by two additional metrics. One is a sliding window evaluation of the presence and duration of a sequence of low quality detected bits. The other is an evaluation of cost factor sequences.

The above characteristics may be attained by a system that identifies a portion of data with a probability of being erroneously decoded by a convolutional decoder, that decodes the data with the convolutional decoder, and that further decodes the data with a second decoder by taking into account that the data has a portion that has been identified to have a probability of having been erroneously decoded by the convolutional decoder. The further decoding may be performed by a block decoder, and the convolutional decoder and the block decoder perform soft-decision decoding according to quality information derived from the quality of a signal from which decoded data has been obtained. The soft-decision convolution decoding may be carried out with soft-decision Viterbi decoding, and the block decoding may be carried out with Reed Solomon decoding.

The above characteristics may also be carried out by identifying or detecting a portion of data with a probability of being erroneously decoded by a convolutional decoder; decoding the data with the convolutional decoder; and further decoding the data with a second decoder by taking into account that the data has a portion that has been detected or identified to have a probability of having been erroneously decoded by the convolutional decoder.

DETAILED DESCRIPTION

Figure 1:
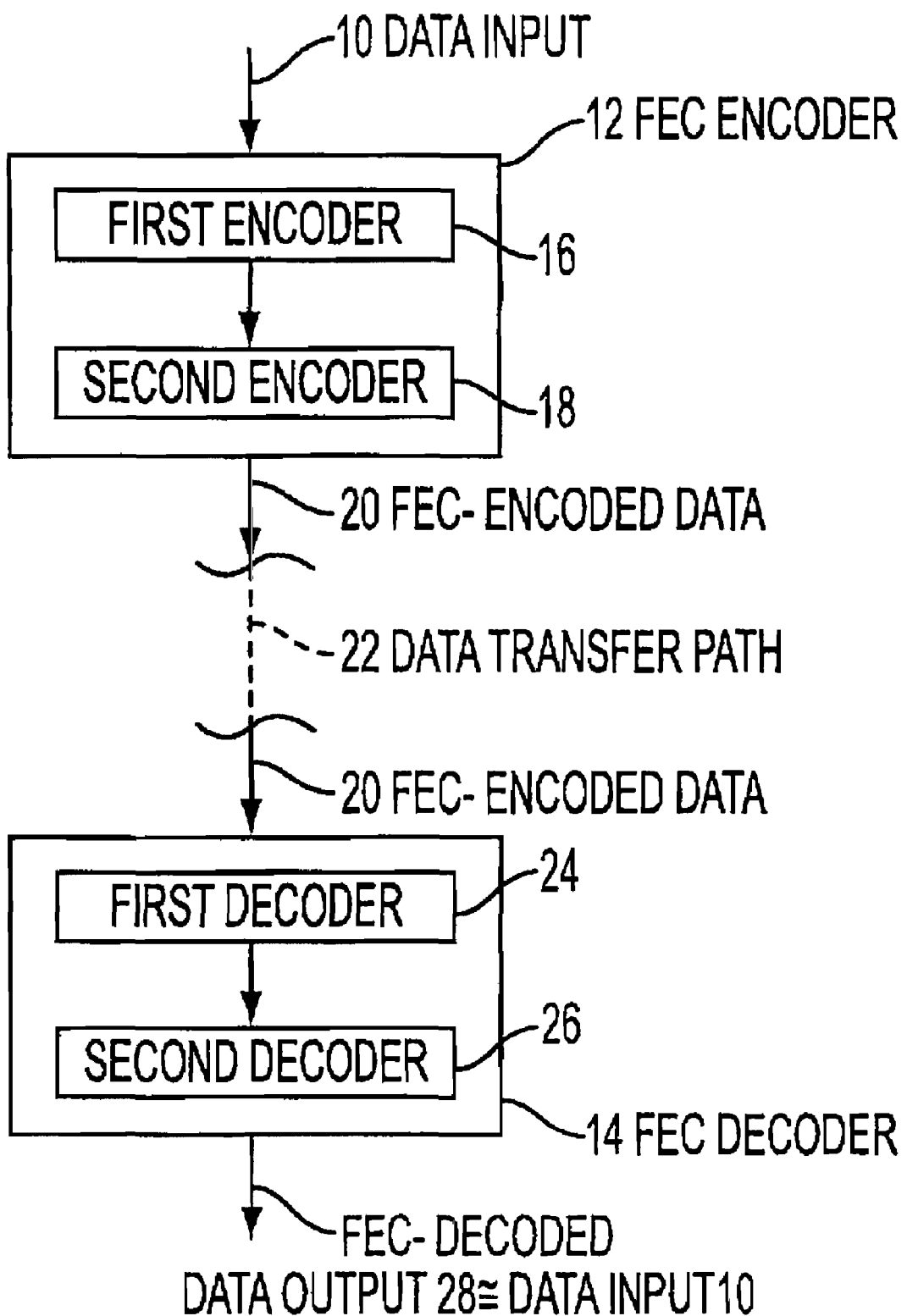
FIG. 1 illustrates a communication system for transmitting digital data through a channel using Forward Error Correction (FEC) coding and decoding to mitigate errors.

Referring to FIG. 1, a communication system is illustrated for transmitting digital data through a channel using Forward Error Correction (FEC) coding and decoding to mitigate errors. Data input 10 is passed to an FEC encoder 12. The FEC encoder 12 includes a first encoder 16, and a second encoder 18. The first encoder 16 and the second encoder 18 perform concatenated linear FEC encoding. The first encoder 16, sometimes called the outside encoder, is typically a block encoder. The data input 10 is block encoded by the first encoder 16, whose output is passed to the second encoder 18. The second encoder 18, sometimes referred to as the inner encoder, typically performs convolutional encoding of the data output by the first encoder 16. The convolutionally and block encoded data 20 is output by the FEC encoder 12.

The FEC encoded data 20 is transferred across a data transfer path 22. The data transfer path 22 (or "channel") is typically a radio transmission link, a data network path, a databus, etc. Noise is typically introduced in the data transfer path, which makes reception of the correct data difficult. A storage device, such as a digital optical storage disk, may also be used as a data transfer path 22. In such a case, FEC encoded data 20 is stored on the disk, and is read from device and passed to an FEC decoder 14.

The FEC decoder 14 is equipped with a first decoder 24 and a second decoder 26. The first decoder 24, often referred to as the inner decoder, decodes the FEC encoded data 20 with a decoding process corresponding to the encoding performed by the second encoder 18. Output of the first decoder 24 is processed by the second decoder 26, also known as the exterior decoder. The second decoder 26 performs a decoding process corresponding to the encoding performed by the first encoder 16. The resulting FEC decoded data output 28 is approximately equal to the data input 10, where effects of noise added to the FEC encoded data 20 introduced during transfer across the data transfer path 22 are nominally mitigated by either the first decoder 24 or the second decoder 26. Perfect error correction is not generally guaranteed, and some bits in the decoded data output 28 may not equal their counterparts in the data input 10.

Figure 2:
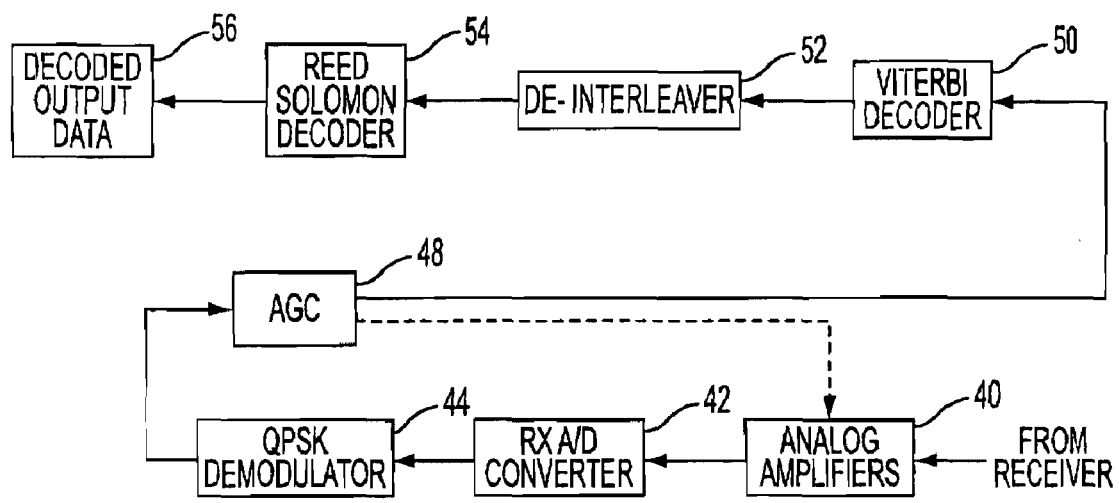
FIG. 2 illustrates a block diagram of the FEC decoder 14 of FIG. 1.

Referring to FIG. 2, illustrates a block diagram with additional details of the FEC decoder 14 of FIG. 1. Analog amplifiers 40 amplify a received analog signal. The amplified signal is fed to a rectifying analog digital converter 42. The AGC circuit 48 maintains the amplifier level so as to not overdrive the converter. The converter 42 derives digital data from the amplified signal, which is passed to a quadrature phase shift keyed (QPSK) demodulator 44. The QPSK demodulator 44 uses variations in 90° phase shift intervals in the amplified digital signal to weight or rank the quality of a bit corresponding to a given 90° interval. The QPSK demodulator 44 outputs three bits for each one-bit data value, where the three bits indicate whether the data value is 0 or 1, and also indicate the level of correctness of the 0 or 1 value. For example, eight levels of correctness or quality, zero through seven, are indicated. A level of zero indicates a very high level of correctness that a binary zero was sent and a very low level of correctness that a binary one was sent. A level of seven would indicate a high level of correctness that a binary one was sent and a very low level of correctness that a binary zero was sent. Most importantly, a level of three or four would indicate high uncertainty for either a binary zero or a binary one. Thus, levels of correctness of three or four typically indicate low quality bits. The 3-bit units outputted by the QPSK demodulator 44 are received by the automatic gain control (AGC) 48, which adjusts the gain of the amplifiers 40.

This illustrated arrangement of the AGC 48 receiving input from the demodulator 44 is one example and, alternatively, the AGC 48 may instead receive input from the analog to digital converter 42, without demodulation.

A Viterbi decoder 50 (inner decoder) receives the correctness-weighted data bits and performs conventional soft-decision Viterbi decoding. The first decoded output of the Viterbi 50 is passed to the de-interleaver 52, which may form Reed Solomon symbols by forming 8-bit groups from the Viterbi output, and which de-interleaves the output of the Viterbi decoder 50. When the de-interleaver is used to form the symbols for Reed Solomon decoding, the de-interleaver 52 may be considered part of the Reed Solomon decoding process. The output of the de-interleaver 52 flows to the Reed Solomon decoder 54 (outer decoder). The Reed Solomon decoder 54 performs Reed Solomon decoding without erasure and without referring to the correctness level of the data decoded by the Viterbi decoder 50. This feature is discussed in detail below. The Reed Solomon decoder 54 outputs decoded output data 56, which approximately equals the data input 10.

Concatenated Viterbi and Reed Solomon decoding as described above may be implemented with available hardware. For example, an L64704 satellite decoder, produced by LSI Logic, may be used.

Concatenated convolutional and block decoders sometimes produce bursts of errors at the convolutional decoding stage when low quality bits occur in bursts or groups. Such bursts may occur randomly as a result of receiver noise, or they may occur with regularity as a result of nearby pulse sources, such as pulse radar.

Viterbi decoding is accurate at correcting intermittent or interspersed corrupted bits. The value of a Viterbi output bit (a "hard" 1 or 0) depends in part on the quality measure of the H previous input bits, where H is the code history size. When a number of low quality bits appear sequentially or nearly sequentially, the Viterbi decoder generates output errors, usually without any indication of such error.

Reed Solomon decoding is well suited to correcting these bursts of errors. Typically, bits are grouped into 8-bit symbols, groups of which form codewords. The codewords (or blocks) of 8-bit symbols contain redundancy data symbols, or parity symbols, which are used to correct a number of symbol errors equal to one-half the number of redundant, or parity, symbols (when erasure, discussed below, is not used). If any bit in a symbol is corrupted, then the entire symbol is corrupted. For example, if a Reed Solomon decoder is capable of correcting up to 10 symbol errors (this number depends on the degree of redundancy in the code), and an error burst of 11 bit in error occurs, only 2 or 3 Reed Solomon symbols in a codeword might be in error, which the exemplary Reed Solomon decoder can easily correct. However, if the 11 bit errors were dispersed evenly throughout the code word, up to 11 symbols could be in error. The Reed Solomon decoder can correct no more than 10 symbol errors, and therefore the codeword containing the 11 bit/symbol errors would be in error or corrupt. That is to say, the Reed Solomon decoder could not correct the codeword.

With Reed Solomon decoders, if symbol errors are known before decoding, Reed Solomon decoding with erasure may be performed. With erasure, symbols in error are ignored. Error symbols may be ignored or erased because the Reed Solomon decoder decides which codeword was intended or sent based on the minimum distance between the received codeword and each of the set of possible matching codewords. This symbol difference count is sometimes referred to as the Hamming distance.

If "L" is defined to be the number of symbols in a codeword containing 1 or more bit errors, and "S" is defined to be the number of symbols erased from the codeword, then "D," the number of parity symbols included with the codeword, is greater than or equal to two times L plus S. This relation may also be expressed by the formula:

$$2L+S<D$$

It can be seen that if all error symbols in a codeword could be identified and erased, twice as much interference duty cycle would be mitigated. In other words, if all symbols with errors were known and ignored (erased), then the distance to the correct Reed Solomon codeword would be 0. However, there is a limit on the number of erasures within a codeword; too many symbol erasures may lead to a Hamming distance of 0, resulting in the unacceptable possibility of matching multiple codewords. Thus, the correct codeword could not be accurately selected or determined.

If a mechanism for identifying error-prone groups of low quality bits received by the Viterbi decoder is used that tends to produce false positives, this would result in a tendency to identify and erase as erroneous too many Reed Solomon symbols containing bits corresponding to low quality Viterbi input bits, which would cause system performance to suffer. Performance would suffer because some portion of the low quality bits (and corresponding symbols) are not in error and because many of the other (truly erroneous) low quality bits (and corresponding symbols) would be corrected by the Viterbi decoder before they are received by the Reed Solomon decoder.

By predicting which Viterbi input bits are likely to fail to be corrected by the Viterbi decoder, it becomes possible to perform Reed Solomon erasure on symbols containing or corresponding to those pre-identified Viterbi error-prone bits, thereby improving throughput and/or reducing the overall bit error rate (BER).

Error correction decoding according the various embodiments enables near optimum Reed Solomon decoding with erasure in concatenated Viterbi and Reed Solomon coding systems. Characteristics or parameters of low quality bit groupings that are likely to be erroneously Viterbi decoded may be determined in advance. These characteristics are used to identify error patterns, information of which is used for Reed Solomon erasure. A process of determining these characteristics or parameters for a sliding window detector is discussed in detail (note particularly FIGS. 8-10 and the text describing those drawings) in U.S. Pat. No. 7,093,188, which is incorporated by reference herein, in its entirety, for all purposes.

When bursts of input noise occur, a string or sequence of input bits will have a high concentration of bits with a low correctness level or quality measure. When the noise pulse is long enough, there is a high probability that the Viterbi output will produce a corresponding error burst. Because, as discussed above, the convolutional or Viterbi decoder decodes an output bit based on a limited number of consecutive previous input bits (bit history H), a Viterbi error output is expected. Viterbi error correction fails when the Viterbi decoder is supplied with a string of consecutive, or nearly consecutive, low-quality bits. The length of a pulse of low quality bits that will have a high probability of erroneous Viterbi decoding depends on a number of factors, discussed further below. When such factors are taken into account, the Reed Solomon decoder can be notified when the Viterbi decoder is likely to break down due to an error burst.

When the Viterbi decoder encounters a sequence of bits that causes the decoder to jump to a different point in the decode trellis as corresponding to a better maximum likelihood choice, this is an indication of an "off track" condition wherein the Viterbi decoder had been on an incorrect decode path and switched to a correct decode path, or vice versa, had been on a correct decode path and switched to an incorrect decode path. Specifically, when a Viterbi decoder changes its mind in mid-decode, this is an indication there is a likelihood that a decode error is occurring with the present bit or within one of the five immediately prior bits. Occurrence of such an "off track" event has been discovered to be an excellent predictor of when the Viterbi decoder is encountering a sequence of bits that it has a high probability of capably decoding correctly. Identification of such off track events inside the Viterbi decoder helps to identify bit quality patterns or groupings that are likely to result in Viterbi failure, and such identification is used to instruct the Reed Solomon decoder to perform erasure on corresponding symbols likely to contain corresponding Viterbi errors.

When an off track event has been detected in a Viterbi decoder, a retrospective look may then be taken of the summation of cost factors for the various alternative paths back through the decode trellis. When no low cost alternative exists amongst the alternative paths, and when the high cost choices lingers over an excessively long duration, this is an indication that a single symbol erasure may not be sufficient and that an additional one or two contiguous symbols may need to be erased. This cost factor summation technique helps to identify bit quality patterns or groupings that are likely to result in Viterbi failure, and such identification is used to instruct the Reed Solomon decoder to perform erasure on corresponding symbols likely to contain corresponding Viterbi errors.

The soft-decision bit quality data (correctness bits) already being supplied to the Viterbi decoder is processed in parallel by a detector, while or before being processed by the Viterbi decoder. When an off track event has been detected in a Viterbi decoder, this sliding window detector helps to identify bit quality patterns or groupings that are likely to result in Viterbi failure, and such identification is used to instruct the Reed Solomon decoder to perform erasure on corresponding symbols likely to contain corresponding Viterbi errors.

Figure 3A:
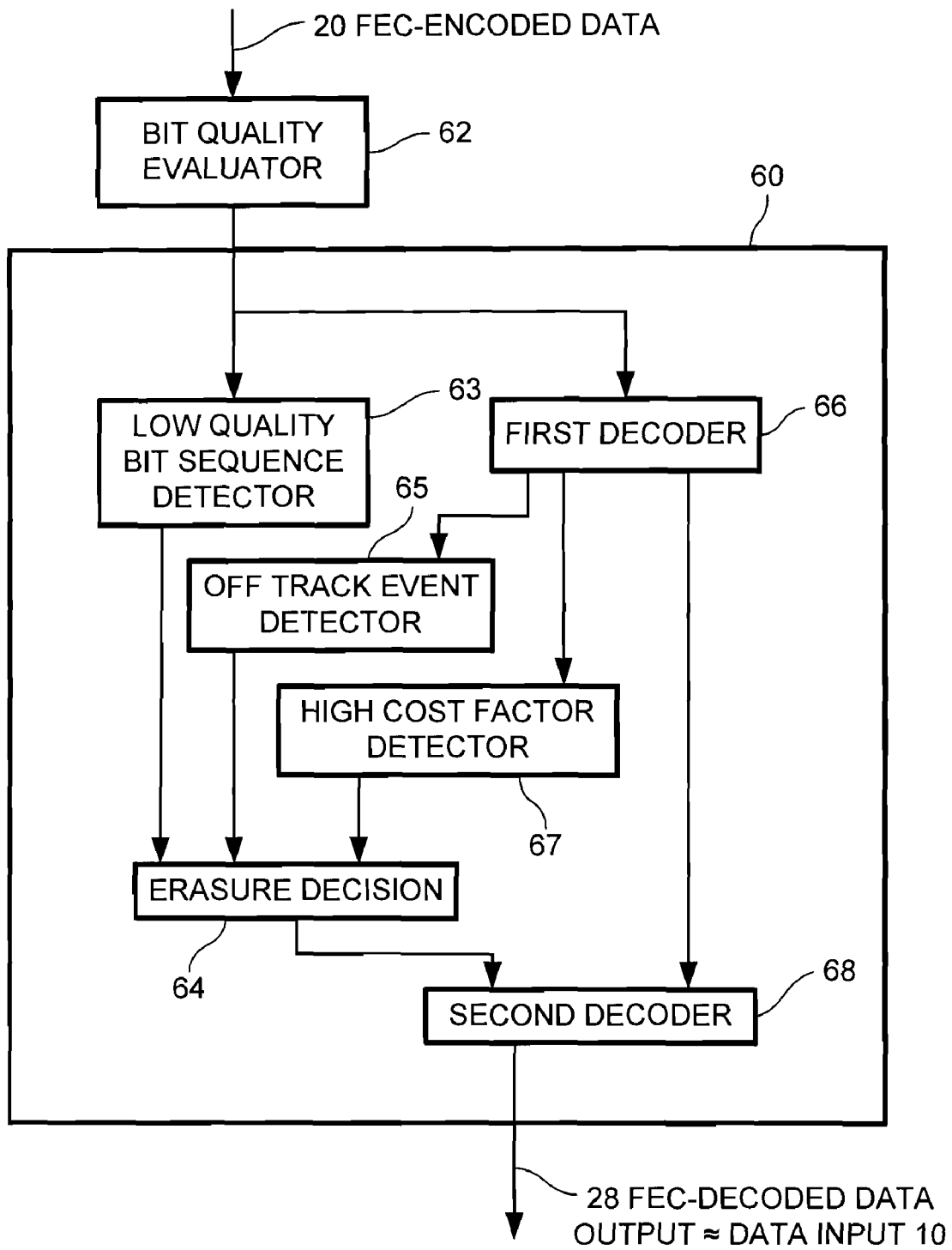
FIG. 3A illustrates a block diagram of a decoding unit 60 according to one alternate embodiment.

Referring to FIG. 3A, a block diagram of a decoding unit 60 is illustrated according to one alternate embodiment of the invention. FEC encoded data is received by the decoding unit 60. A bit quality evaluator 62 assigns a quality or correctness weighting to each input bit. The correctness-weighted data is processed by the first decoder 66. According to the illustrated embodiment a soft decision Viterbi decoder is used as the first decoder 66, wherein the correctness-weighted data is processed by the first decoder 66, considering the bit quality evaluations by the evaluator 62, the evaluator 62 being a part of the QPSK detector (refer to FIG. 2) and feeding its output to both a low quality bit sequence detector 63 and the first decoder 66. The low quality bit sequence detector 63 analyzes the quality evaluations output by the bit quality evaluator 62 to detect sequential or near sequential groups of low quality bits. An off track event detector 65 determines when an off track event has occurred while the first decoder 66 is determining a maximum likelihood path through a decode trellis. A high cost factor detector 67 determines when no low cost alternative exists amongst the alternative trellis paths, and when the high cost choices linger over an excessively long duration in the trellis. An erasure decision circuit 64 receives the detection signals from the low quality bit sequence detector 63, the off track event detector 65, and the high cost factor detector 67, and compares the relative timing and duration of these detection signals. A second decoder 68 decodes the output of the first decoder 66 based, in part, on error identification information received by the erasure decision logic circuit 64. The second decoder 68 outputs FEC decoded data output 28, which is approximately equal to data input 10; the source data before being FEC encoded.

Figure 3B:
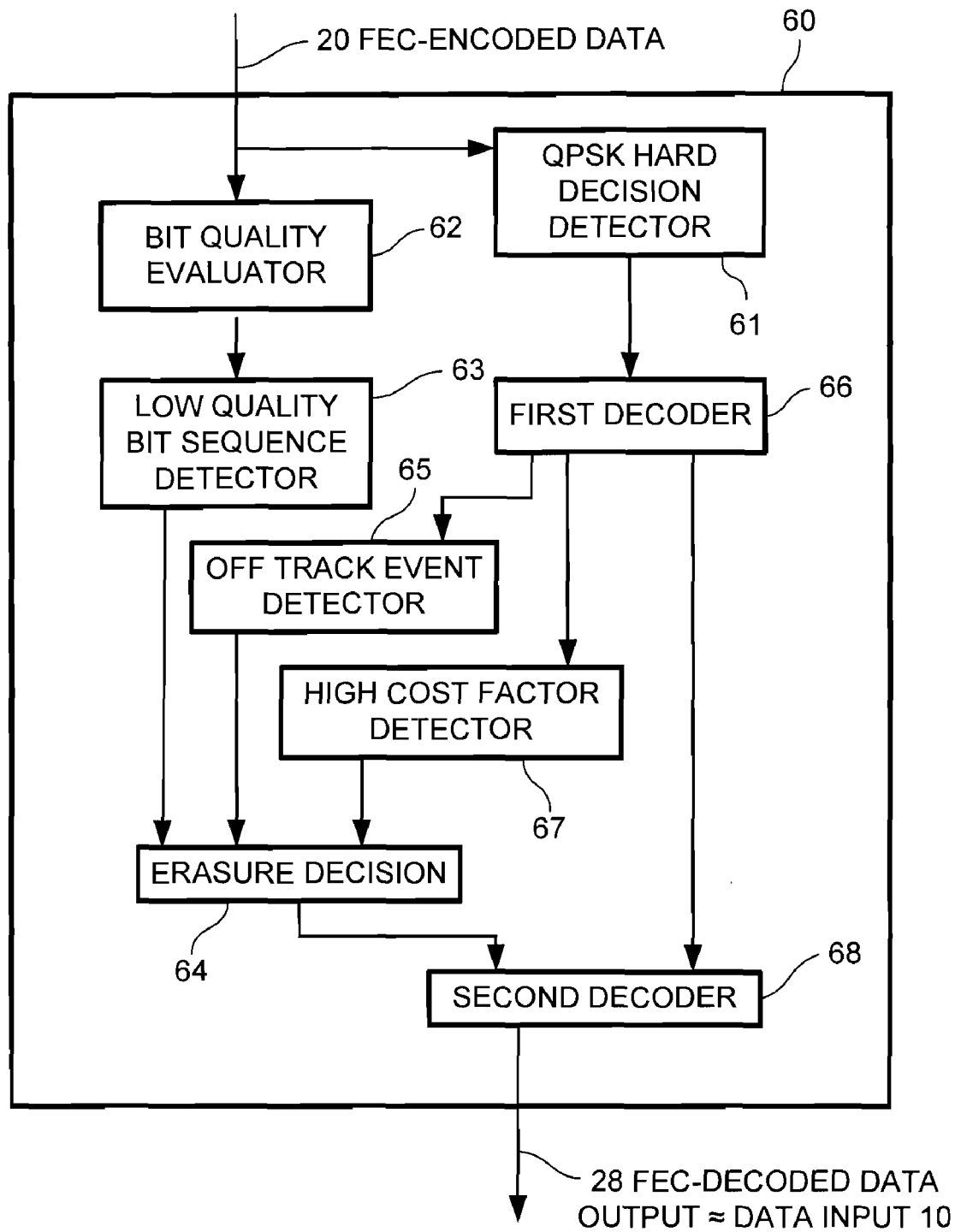
FIG. 3B illustrates a block diagram of a decoding unit 60 according to another alternate embodiment.

Referring to FIG. 3B, a block diagram of a decoding unit 60 is illustrated according to another alternate embodiment of the invention. FEC encoded data is received by the decoding unit 60. A bit quality evaluator 62 assigns a quality or correctness weighting to each input bit. The correctness-weighted data is processed by the first decoder 66. According to the illustrated embodiment, a hard decision Viterbi decoder 61 is used before the first decoder 66, so that the first decoder 66 is not connected to receive output form the evaluator 62. A low quality bit sequence detector 63 analyzes the quality evaluations output by the bit quality evaluator 62 to detect sequential or near sequential groups of low quality bits. An off track event detector 65 determines when an off track event has occurred while the first decoder 66 is determining a maximum likelihood path through a decode trellis. A high cost factor detector 67 determines when no low cost alternative exists amongst the alternative trellis paths, and when the high cost choices linger over an excessively long duration in the trellis. An erasure decision circuit 64 receives the detection signals from the low quality bit sequence detector 63, the off track event detector 65, and the high cost factor detector 67, and compares the relative timing and duration of these detection signals. A second decoder 68 decodes the output of the first decoder 66 based, in part, on error identification information received by the erasure decision logic circuit 64. The second decoder 68 outputs FEC decoded data output 28, which is approximately equal to data input 10; the source data before being FEC encoded.

According to one embodiment, a demodulator may serve as the bit quality evaluator 62, the first decoder 66 may be a convolutional or Viterbi decoder, and the second decoder 68 may be a Reed Solomon decoder using erasure based on information provided by the erasure decision circuit 64.

According to one embodiment, the low quality bit sequence detector 63 may use a sliding window of M of N bits to detect a sufficiently long sequence of low quality bits.

According to another alternate embodiment, the low quality bit sequence detector 63 may perform error detection using two parallel sliding windows of M of N bits, the parallel two sliding windows being time delayed with respect to one another.

Figure 4:
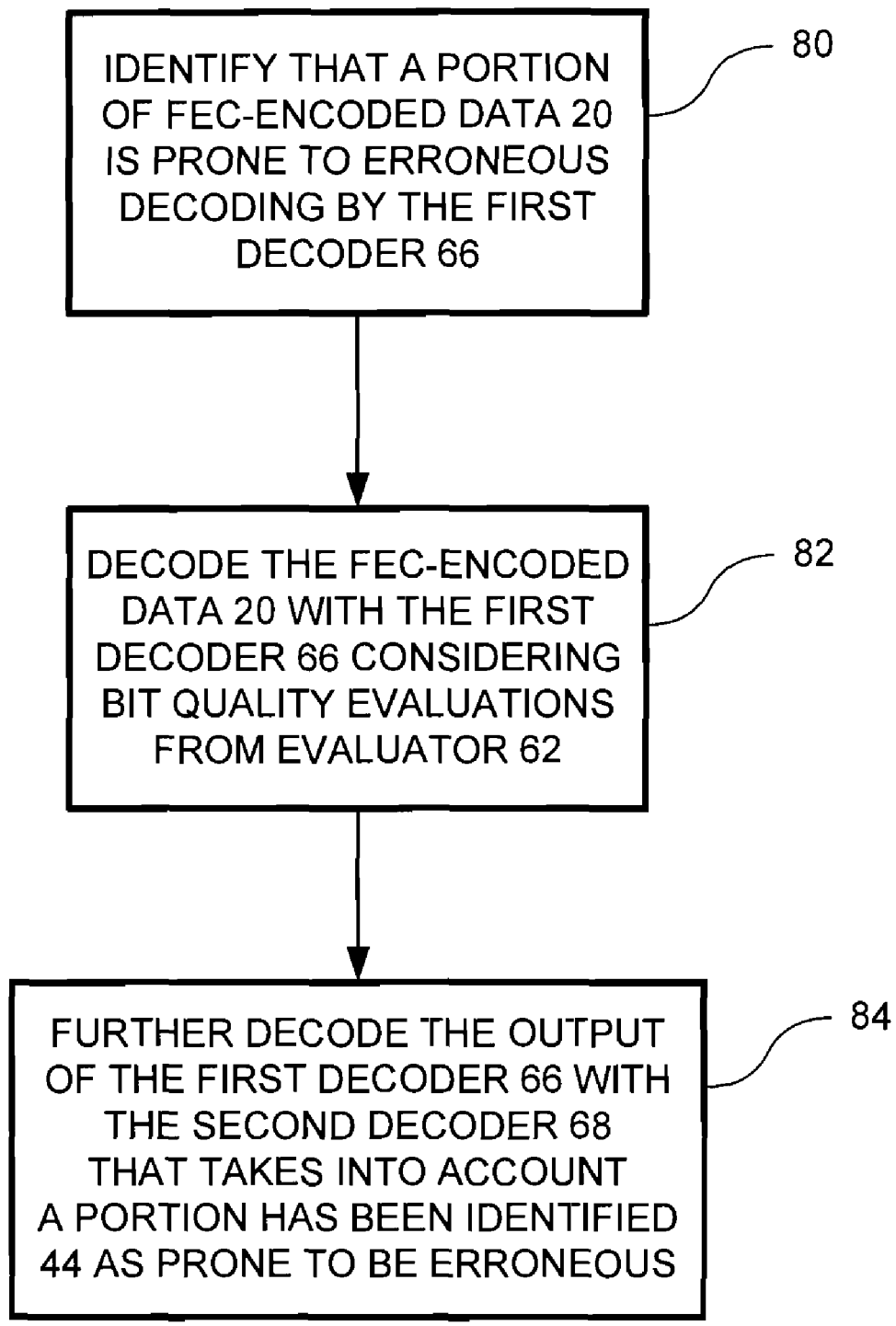
FIG. 4 illustrates a flowchart of a decoding process carried out by the decoding unit 60.

Referring to FIG. 4, a decoding process is illustrated as carried out by the decoding unit 60. A portion of FEC encoded data 20 being evaluated by the erasure decision circuitry 64 is identified 80 to be prone to erroneous decoding by the first decoder 66. The FEC-encoded data is decoded 82 by the first decoder 66, considering the bit quality evaluations by the evaluator 62 (unless a hard decision decoding is used by the first decoder 66, in which case the bit quality evaluations are not considered by the first decoder 66). The output of the first decoder 66 is further decoded 84 with the second decoder 68, by taking into account a portion of encoded data 20 that has been identified as prone to be erroneously decoded.

Figure 5:
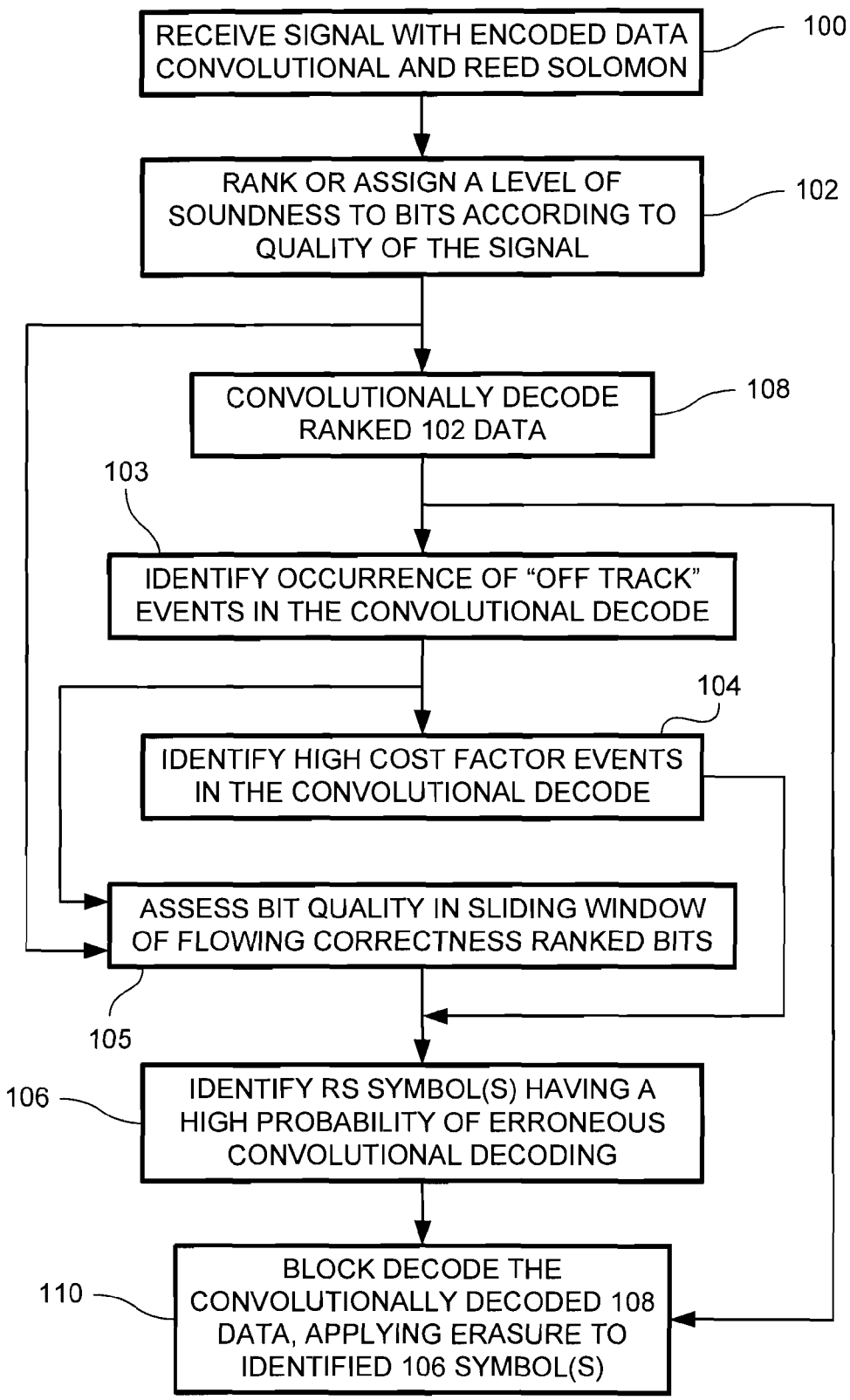
FIG. 5 illustrates a flowchart of an embodiment of the process shown in FIG. 4.

Referring to FIG. 5, an embodiment of the process shown in FIG. 4 is illustrated. The decoding unit 60 receives 100 a signal with convolutional and Reed Solomon encoded data. A rank or level of correctness is assigned 102 to bits according to the quality of the signal. The quality rated bits are assessed 105 in the low quality bit sequence detector 63. The quality ranked bit data generated by the assigning 102 is convolutionally decoded 108 by the first decoder 66. During the process of the convolutional decode 108, any "off track" events are noted to identify 103 a portion of the received data that has a high probability of being not correctable by the convolutional decoder. If an off track event is identified 103, then a retrospective look is taken of the decode trellis to identify 104 high cost factor with substantial duration to as an indication whether more than one symbol should be erased. A sliding window is applied to the quality ranked data output from the bit quality evaluator identify 105 a sequence of low quality bits, as distinguished from occasional isolated low quality bits.

Based primarily on tagging by the off track event detector 65, and using outputs from the high cost factor detector 67 and the low quality bit sequence detector 63 to select duration and timing (forward or backward), one to three block code symbols are identified 106 as having a probability of being erroneously convolutionally decoded by the first decoder 66. The convolutionally decoded data generated by the convolutional decoding 108 is block decoded 110 by applying erasure to the identified symbols.

Figure 6:
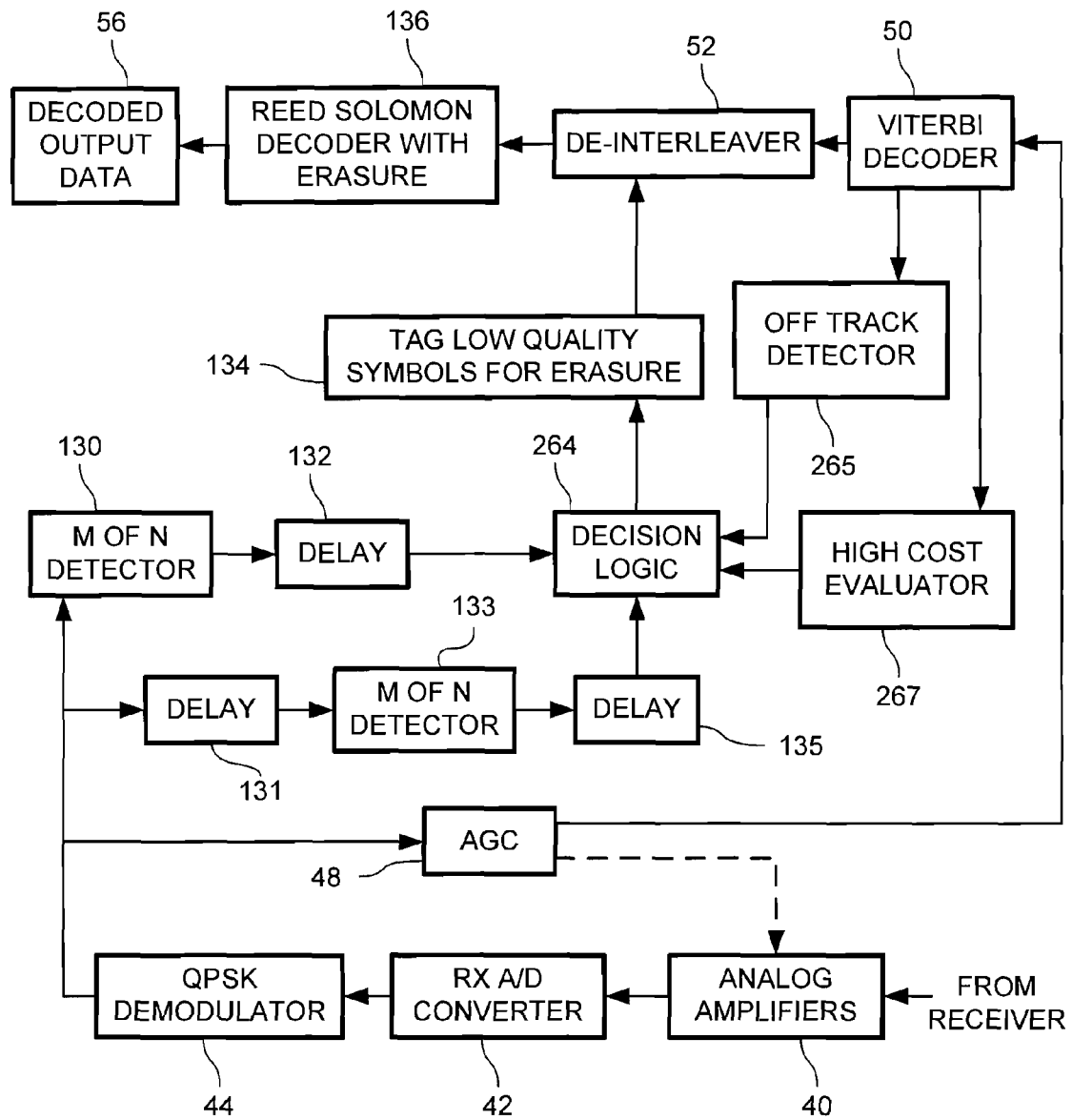
FIG. 6 illustrates a block diagram of a receiver implementing a decoder structure according to one embodiment.

Referring to FIG. 6, an embodiment of a decoder is illustrated. The analog amplifiers 40, de-interleaver 52, and decoded output data 56 are discussed above with reference to FIG. 2. The relations and interactions between the analog amplifiers 40, the RX A/D converter 42, the QPSK demodulator 44, the AGC circuit 48, and the Viterbi decoder 50 are essentially described above with reference to FIG. 2.

In the detector shown in FIG. 6, the correctness-rated output of the QPSK demodulator 44 is received directly at the input of the AGC 48, directly at the input of an M of N detector 130, and indirectly to the input of another M of N detector 133 via a time delay 131. The M of N detectors 130, 133 act collectively to detect sequences and patterns of sequences of low quality bits that tend to be difficult for a Viterbi decoder to correctly decode. Taken collectively, the M of N detectors 130, 133 and their associated delay blocks 131, 132, 135 correspond functionally to the low quality bit sequence detector 63 of FIG. 3A or FIG. 3B. The decision logic 264 receives tagging information from the delay blocks 132, 135 to aid in identification of symbols to be erased. The delays 132, 135 enable the output of the Viterbi decoder 50, delayed by decoding, to catch up with and synchronize with the tagging information generated by the M of N detectors 130, 133. This synchronization enables the tagging unit 134 to tag symbols output by the Viterbi decoder 50 that correspond to bits determined by the M of N detector 130 to be in a group or burst of quality ranked bits that are likely to or have a probability of being incorrectly decoded by the Viterbi decoder 50.

An off track event detector 165 determines when an off track event has occurred while the Viterbi decoder 50 is determining a maximum likelihood path through a decode trellis. The decision logic 60 receives off track occurrence information from the off track even detector 165 to identify a primary Reed Solomon symbol to be erased. An informal definition of an off track event is the occurrence of a jump when a Viterbi decoder changes its mind in mid-decode, thereby signaling there is a likelihood that a decode error is occurring with the present bit or within one of the five immediately prior bits. A more technically precise definition according to one embodiment is that an off track event is identified when there is a trellis decoding path change such that the last state of the current lowest cost path does not agree with the penultimate (i.e., second-to-last) state of the previous lowest cost path. One way of implementing such a detector is to detect corruption in the data stream by evaluating if no relatively low cost factor path exists through a trellis of the soft-decision convolutional decoding and the duration of high cost factor paths through the trellis.

A high cost factor detector 167 determines when no low cost alternative exists amongst the alternative trellis paths in the Viterbi decoder 50, and when the high cost choices linger over an excessively long duration in the trellis. The decision logic 60 receives high cost information from the high cost factor detector 167 to aid in identification of symbols to be erased.

Another way of implementing such a detector is to detect corruption in the data stream by evaluating the variance of the cost factors of the paths through the trellis. Yet another way of implementing such a detector is to detect corruption in the data stream by detecting on the existence of multiple paths with the lowest cost which lead to conflicting output bit decisions.

The decision logic circuitry 60 receives information from the off track detector 165, the sliding window detectors 130, 133, and the high cost evaluator 167, and compares the relative timing and duration of these detection signals. According to one embodiment no erasure is made unless an off track event has been detected, as indicated by the off track detector 165. For this embodiment the information received from the sliding window detectors 130 and the high cost evaluator 167 are used to determine if the number of low quality bits and high cost duration is small enough for erasure of a single symbol to suffice, or if suppression of likely incorrect decoding by the Viterbi decoder is better achieved by erasing a second or third symbol. The detection signals are also used to determine if any additional symbols to be erased should be erased forward in time or backward in time with respect to the primary Reed Solomon symbol identified for erasure by the off track detector 165.

Based on the decision rendered by the decision logic circuitry 60, the tagging unit 134 directs erasure of one to three consecutive symbols prior to being de-interleaved at the de-interleaver 52.

The de-interleaver 52 receives the tagging information from the tagging unit 134 and the first decoded output from the Viterbi decoder 50. Because Reed Solomon decoding with erasure is usually performed by erasing (ignoring) any symbol which contains a bit in error, the de-interleaver 52 marks for erasure any symbol to be input to the Reed Solomon decoder 136 which contains a bit output by the Viterbi output 50 and tagged by the tagging unit 134.

The Reed Solomon decoder 136 receives the tagged and untagged symbols from the de-interleaver 52 and performs Reed Solomon decoding with erasure. Generally, Reed Solomon decoding is performed on codeword units that are made up of a fixed number of symbols. Some of the symbols in a codeword represent data, and other symbols in a codeword contain parity information that is used to correct errors in the data symbols. Reed Solomon decoders generally decide which codeword is the correct codeword based on the minimum of the distances between the received codeword and each of the set of possible matching codewords. Therefore, by enabling concatenated Viterbi soft-decision decoding and Reed Solomon soft-decision decoding, the various embodiments can correct twice as many symbol errors as a concatenated decoder using Reed Solomon hard decision decoding (decoding without erasure).

Although the M of N detectors 130, 133 have been described with reference to a fixed-length sliding window, other configurations may also be used. For example, the parameters of the M of N detectors 130, 133 may be dynamically set based on conditions within the decoding unit 60. The operations of the M of N detectors 130, 133 and their associated delays 131, 132, 135 may also be externally configurable or programmable. Furthermore, any number of hardware or software arrangements may be used to enable Reed Solomon soft-decision decoding with erasure based on predictable patterns of Viterbi decoding errors.

Figure 7:
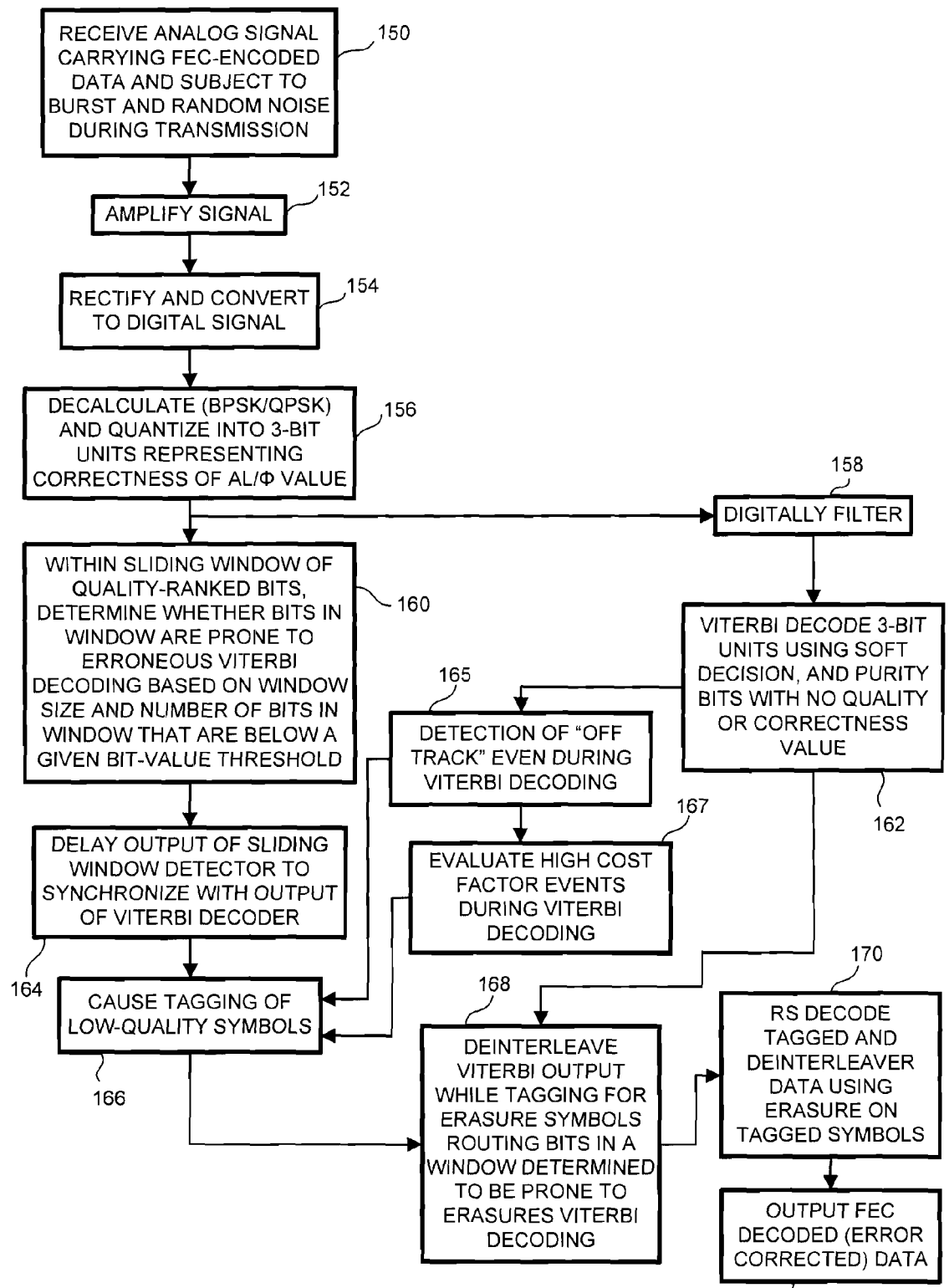
FIG. 7 illustrates a flowchart for a process according to the receiver of FIG. 6.

Referring to FIG. 7, a flowchart illustrates a process according to the embodiment of FIG. 6. An analog signal carrying FEC decoded data that has been subject to burst and/or random noise during transmission is received 150. The signal is amplified 152 and converted 154 to a digital signal. The digital signal is demodulated 156, using, for example, binary or quadrature phase shift keying, and is quantized into 3-bit units representing the correctness of a 1 or 0 data value. The quantized or correctness ranked digital data is channeled to two different parallel processing paths.

In the first quantized bit processing path, the quantized or quality ranked bits are digitally filtered 158 and Viterbi decoded 162 using soft-decision decoding according to the correctness of individual data bits as indicated by the 3-bit units. Generally, the Viterbi soft-decision decoding 162 consumes or does not output the quality ranking, and outputs hard (unranked) Viterbi decoded bits, which have no inherent quality or correctness value or rating. Off track events in the Viterbi decode are detected 165 and high cost paths are evaluated 167 in the Viterbi decode trellis.

In the second parallel quantized bit processing path, within a sliding window of the quality ranked bits, it is determined 160 whether bits in the window are prone to erroneous Viterbi decoding. This determination may be based on the size of the window (e.g., the number of bits in the window), and also on the number or concentration (M/N) of bits in the window at a given time that have a quality level below a given bit quality threshold. The bit stream in this path, including the bits (or corresponding bits) detected or determined 160 to be prone to erroneous Viterbi decoding, is delayed 164.

With the detection 165 of off track event, and supplemented by information regarding high cost trellis branches 167 and low quality bit sequences 160, symbols having a high likelihood of being incorrectly decoded by the Viterbi decoder are tagged 166 for erasure.

The bits output by the Viterbi decoding 162 that correspond to bits determined 165, 167, 160 to be prone to erroneous Viterbi decoding are tagged 166 for erasure 168. The Viterbi decoded 162 output, including the bits tagged for erasure 168, are Reed Solomon soft-decision decoded 170 by erasing symbols that contain tagged bits. The result is outputted 172. Accordingly, the second-decoded output of the Reed Solomon decoding 170 has been error corrected.

The method and apparatus of these various embodiments provide improved system performance in the presence of pulsed and continuous interference. Error correction of conventionally encoded data is improved, and the overhead rate (number of code/parity bits) is not increased.

A method and apparatus for decoding of forward error correction encoded signals have been described. It will be understood by those skilled in the art that the disclosed technology may be embodied in other specific forms without departing from the scope of the inventions disclosed and that the examples and embodiments described herein are in all respects illustrative and not restrictive. Those skilled in the art of the present invention will recognize that other embodiments using the concepts described herein are also possible. Further, any reference to claim elements in the singular, for example, using the articles "a," "an," or "the" is not to be construed as limiting the element to the singular.

What is claimed is:

1. A method of electronic decoding comprising:
   receiving, at a bit quality evaluator, a data stream comprising a sequence of bits;
   assigning, using the bit quality evaluator, a quality measure to each bit within the sequence of bits;
   receiving, at a first decoding device, the sequence of bits and the quality measure;
   performing, using the first decoding device, soft decision convolutional decoding on the sequence of bits using the quality measure;
   identifying, using an off-path detector, an occurrence of a trellis decode path change during the convolutional decoding of the sequence of bits by the first decoder;
   identifying, using the off-path detector, a first symbol proximate to the sequence of bits corresponding to the occurrence of the trellis decode path change;
   identifying, using the erasure decision circuit, at least the first symbol for erasure;
   receiving, at a second decoder, the output of the first decoder and the erasure decision circuit;
   decoding, using a second decoding device, the output of the first decoder after erasing at least the first symbol; and
   outputting from the second decoding device decoded corrected data.

2. The method of claim 1, wherein the data stream comprises error correction encoded data, wherein the first decoding device comprises a Viterbi decoder and wherein the second decoder comprises a Reed Solomon block decoder with erasure.

3. The method of claim 1 further comprising:
   assessing, using a high cost factor detector, one or more trellis decode paths for corruption of additional symbols corresponding to the sequence of bits;
   receiving, at the erasure decision circuit, a signal from the high cost factor detector;
   determining, using the erasure decision circuit, from the signal from the high cost factor detector whether one or more additional symbols are corrupted; and
   decoding, using a second decoding device, the output of the first decoder after erasing at least the first symbol and the one or more additional symbols when one or more additional symbols are determined to be corrupted.

4. The method of claim 3, wherein assessing, using a high cost factor detector, one or more trellis decode paths for corruption of additional symbols corresponding to the sequence of bits comprises determining whether a low cost factor path exists through a trellis of the first decoding device and the duration of high cost factor paths through the trellis.

5. The method of claim 3, wherein assessing, using a high cost factor detector, one or more trellis decode paths for corruption of additional symbols corresponding to the sequence of bits comprises determining that a last state of a lowest cost path after the path change does not agree with a penultimate state of a lowest cost path immediately prior to the path change.

6. The method of claim 1 further comprising:
   determining, using the bit quality evaluator, whether the sequence of bits includes a group of bits having a quality measure below a quality threshold;
   receiving, at the erasure decision circuit, a signal from the bit quality evaluator;
   determining, using the erasure decision circuit, from the signal from the bit evaluator whether one or more additional symbols are corrupted; and
   decoding, using a second decoding device, the output of the first decoder after erasing at least the first symbol and the one or more additional symbols when one or more additional symbols are determined to be corrupted.

7. A decoding apparatus comprising:
   a bit quality evaluator configured for
      a data stream comprising a sequence of bits; and
      assigning a quality measure to each bit within the sequence of bits;
   a first decoding device configured for:
      receiving the sequence of bits and the quality measure; and
      performing, using the first decoding device, soft decision convolutional decoding on the sequence of bits using the quality measure;
   an off-path detector configured for:
      identifying an occurrence of a trellis decode path change during the convolutional decoding of the sequence of bits by the first decoder; and
      identifying a first symbol proximate to the sequence of bits corresponding to the occurrence of the trellis decode path change;
   an erasure decision circuit configured for identifying at least the first symbol for erasure; and
   a second decoder configured for:
      receiving the output of the first decoder and the erasure decision circuit;
      decoding the output of the first decoder after erasing at least the first symbol; and
      outputting decoded corrected data.

8. The apparatus of claim 7, wherein the data stream comprises error correction encoded data, wherein the first decoding device comprises a Viterbi decoder and wherein the second decoder comprises a Reed Solomon block decoder with erasure.

9. The apparatus of claim 7 further comprising a high cost factor detector configured for assessing one or more trellis decode paths for corruption of additional symbols corresponding to the sequence of bits, wherein;
   the erasure decision circuit is further configured for:

assessing receiving a signal from the high cost factor detector, and determining from the signal from the high cost factor detector whether one or more additional symbols are corrupted, and the second decoding device is configured for decoding the output of the first decoder after erasing at least the first symbol and the one or more additional symbols when one or more additional symbols are determined to be corrupted.

10. The apparatus of claim 9, wherein assessing, using a high cost factor detector, one or more trellis decode paths for corruption of additional symbols corresponding to the sequence of bits comprises determining whether a low cost factor path exists through a trellis of the first decoding device and the duration of high cost factor paths through the trellis.

11. The apparatus of claim 9, wherein assessing, using a high cost factor detector, one or more trellis decode paths for corruption of additional symbols corresponding to the sequence of bits comprises determining that a last state of a lowest cost path after the path change does not agree with a penultimate state of a lowest cost path immediately prior to the path change.

12. The apparatus of claim 7, wherein:

the bit quality evaluator is further configured for determining whether the sequence of bits includes a group of bits having a quality measure below a quality threshold, the erasure decision circuit is further configured for:
  receiving a signal from the bit quality evaluator; and
  determining from the signal from the bit evaluator whether one or more additional symbols are corrupted, and the second decoding device is further configured for decoding the output of the first decoder after erasing at least the first symbol and the one or more additional symbols when one or more additional symbols are determined to be corrupted.

* * * * *